United States Patent
Kim et al.

(10) Patent No.: US 9,564,871 B2
(45) Date of Patent: Feb. 7, 2017

(54) RADIO FREQUENCY FILTER

(71) Applicant: KMW INC., Hwaseong, Gyeonggi-Do (KR)

(72) Inventors: Duk Yong Kim, Gyeonggi-Do (KR); Nam-Shin Park, Gyeonggi-Do (KR)

(73) Assignee: KMW INC., Hwaseong, Gyeonggi-do (KR)

( * ) Notice: Subject to any disclaimer, the term of this patent is extended or adjusted under 35 U.S.C. 154(b) by 72 days.

(21) Appl. No.: 14/277,449

(22) Filed: May 14, 2014

(65) Prior Publication Data

US 2014/0247098 A1 Sep. 4, 2014

Related U.S. Application Data

(62) Division of application No. 12/917,917, filed on Nov. 2, 2010, now Pat. No. 8,749,321.

(Continued)

(51) Int. Cl.
*H01P 1/20* (2006.01)
*H03H 7/46* (2006.01)
(Continued)

(52) U.S. Cl.
CPC .......... *H03H 7/46* (2013.01); *H01P 1/20* (2013.01); *H03H 7/0138* (2013.01); *H03H 7/48* (2013.01);
(Continued)

(58) Field of Classification Search
CPC .................................. H01P 1/20; H01P 1/201
(Continued)

(56) References Cited

U.S. PATENT DOCUMENTS 3,435,384 A 3/1969 Renkowitz
4,825,175 A * 4/1989 Tsuda ........................ H01P 5/12
330/286

(Continued)

FOREIGN PATENT DOCUMENTS

CN 2718802 Y 8/2005
CN 1671068 A 9/2005

(Continued)

OTHER PUBLICATIONS

Chinese Office Action for Chinese Application No. 201080048680.4, dated Oct. 24, 2013.

(Continued)

*Primary Examiner* — Stephen E Jones
(74) *Attorney, Agent, or Firm* — Mintz Levin Cohn Ferris Glovsky and Popeo, P.C.; Kongsik Kim; Colleen H. Witherell (57) ABSTRACT

A Radio Frequency (RF) filter configured by combining a hybrid coupler with a general filter, for having different characteristics from original characteristics of a general filter is provided, in which a coupler receives an input signal through a first port, divides the input signal, outputs the divided signals through second and third ports, combines signals received through the second and third ports according to phases of the signals, and outputs the combined signal through the first port or as an output signal of the RF filter through a fourth port, and a first filter unit has a first port connected to the second port of the coupler and a second port connected to the third port of the coupler, for having a predetermined frequency filtering characteristic.

14 Claims, 9 Drawing Sheets

Related U.S. Application Data (60) Provisional application No. 61/257,102, filed on Nov. 2, 2009.

(51) Int. Cl.
*H03H 7/48* (2006.01)
*H03H 7/01* (2006.01)
*H03H 11/36* (2006.01)
*H04B 1/58* (2006.01)
*H01P 1/203* (2006.01)

(52) U.S. Cl.
CPC ............... *H01P 1/203* (2013.01); *H03H 11/36* (2013.01); *H04B 1/58* (2013.01)

(58) Field of Classification Search
USPC ........ 333/202, 101, 104, 105, 106, 107, 117
See application file for complete search history.

(56) References Cited

U.S. PATENT DOCUMENTS

| | | | |
|---|---|---|---|
| 5,508,661 A | 4/1996 | Keane et al. | |
| 8,264,298 B2 * | 9/2012 | Kenington | H03H 2/00 333/126 |
| 2007/0210879 A1 * | 9/2007 | Cardona | H03H 9/172 333/188 |
| 2010/0148886 A1 | 6/2010 | Inoue et al. | |

FOREIGN PATENT DOCUMENTS

| | | |
|---|---|---|
| DE | 10304524 A1 | 8/2004 |
| EP | 0273793 A1 | 7/1988 |
| EP | 0724337 A2 | 7/1996 |
| JP | 63-206029 A | 8/1988 |
| JP | 2001-196862 A | 7/2001 |
| JP | 2005-311738 A | 11/2005 |
| JP | 2007-208350 A | 8/2007 |
| KR | 10-2006-0000150 A | 1/2006 |
| KR | 2010-0134324 A | 12/2010 |
| WO | WO-90/12429 A1 | 10/1990 |
| WO | 95-15018 A1 | 6/1995 |
| WO | WO-2009/078095 A1 | 6/2009 |

OTHER PUBLICATIONS

European Search Report for European Application No. 10827183.4, dated Apr. 12, 2103.
Japanese Patent Office Decision on Grant for Japanese Application No. 2012-534128, dated Jan. 28, 2014.

* cited by examiner

RADIO FREQUENCY FILTER

CROSS-REFERENCE TO RELATED APPLICATIONS

This is a divisional application of application Ser. No. 12/917,917 filed on Nov. 2, 2010, which claims priority to application Ser. No. 61/257,102 filed Nov. 2, 2009, which applications are incorporated herein by reference.

BACKGROUND OF THE INVENTION

1. Field of the Invention

The present invention relates to a Radio Frequency (RF) filter.

2. Description of the Related Art

A filter is an essential part of an RF system, for passing or rejecting a predetermined frequency band. Filters are classified into Band Pass Filters (BPFs), Band Rejection Filters (BRFs), High Pass Filters (HPFs), Low Pass Filters (LPFs), etc. Such filters are designed so as to satisfy frequency pass or rejection characteristics required for the RF system. Once the filters are installed, their characteristics are difficult to change unless they are replaced. For example, when a BRF is to be reinstalled in an RF system equipped with a BPF, the BPF should be removed and then replaced with the BRE. The filter replacement may lead to communication disconnection and increase cost.

Meanwhile, the BRF is designed by connecting resonators using a 50-ohm (Ω) line. In this case, since no coupling occurs between resonators, a frequency band equal to or wider than a predetermined bandwidth cannot be rejected. In addition, as the number of resonators increases, the total length of the 50-ohm line also increases, thereby increasing path loss. Another shortcoming of the BRF is that a low or high frequency band is selectively rejected with respect to a specific frequency and thus it is difficult to improve band edge characteristics.

SUMMARY OF THE INVENTION

An aspect of embodiments of the present invention is to address at least the problems and/or disadvantages and to provide at least the advantages described below. Accordingly, an aspect of embodiments of the present invention is to provide an RF filter for decreasing path loss.

Another aspect of embodiments of the present invention provides an RF filter for improving band edge characteristics.

Another aspect of embodiments of the present invention provides an RF filter for inverting a signal characteristic easily.

Another aspect of embodiments of the present invention provides an RF filter for rejecting a wide frequency band by increasing coupling between resonators.

A further aspect of embodiments of the present invention provides an RF filter for facilitating design of notch characteristics.

In accordance with an aspect of embodiments of the present invention, there is provided an RF filter in which a coupler receives an input signal through a first port, divides the input signal, outputs the divided signals through second and third ports, combines signals received through the second and third ports according to phases of the signals, and outputs the combined signal through the first port or as an output signal of the RF filter through a fourth port, and a first filter unit has a first port connected to the second port of the coupler and a second port connected to the third port of the coupler, for having a predetermined frequency filtering characteristic.

BRIEF DESCRIPTION OF THE DRAWINGS

The above and other objects, features and advantages of certain embodiments of the present invention will be more apparent from the following detailed description taken in conjunction with the accompanying drawings, in which.

Throughout the drawings, the same drawing reference numerals will be understood to refer to the same elements, features and structures.

DETAILED DESCRIPTION OF EMBODIMENTS

Now, a preferred embodiment of the present invention will be described with reference to the attached drawings. While specific details such as components are described in the following description, they are given to help comprehensive understanding of the present invention. Therefore, it is clearly to be understood to those skilled in the art that changes or modifications can be made to the present invention within the scope and spirit of the present invention.

The following description is given of a so-called chameleon filter which is configured by combining a hybrid coupler with a filter and thus has new characteristics modified from original characteristics. For example, a Band Pass Filter (BPF) and a hybrid coupler may be combined into a chameleon Band Rejection Filter (BRF) and a Low Pass Filter (LPF) and a hybrid coupler may be combined into a chameleon HPF, or vice versa in the present invention.

Now, the present invention will be described in detail with the attached drawings.

Figure 1:
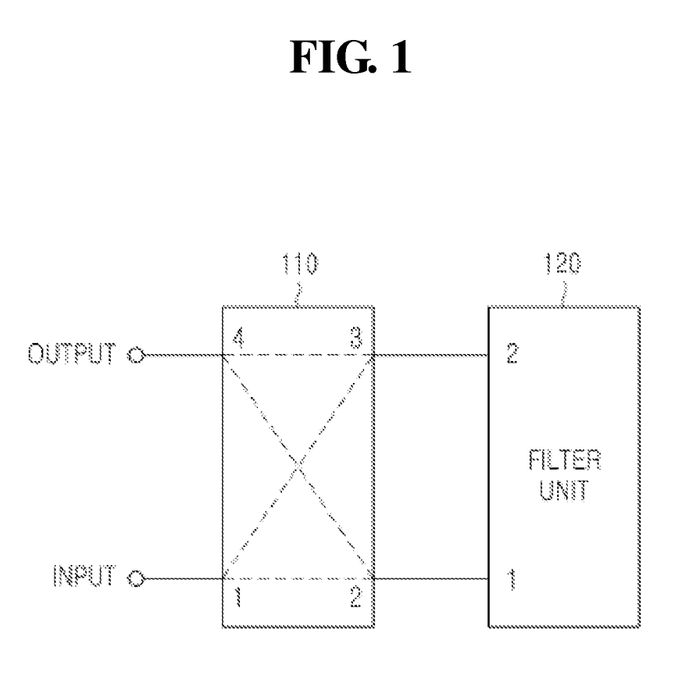
FIG. 1 schematically illustrates the structure of a chameleon filter according to an embodiment of the present invention.

FIG. 1 illustrates the structure of a chameleon filter according to an embodiment of the present invention.

Referring to FIG. 1, a 3-dB hybrid coupler 110 is connected to a filter unit 120 in the chameleon filter according to the embodiment of the present invention. That is, the filter of the present invention is configured so that a first port of the hybrid coupler 110 serves as an input port of the chameleon filter, a fourth port of the hybrid coupler 110 serves as an output port of the chameleon filter, a second port of the hybrid coupler 110 is connected to a first port (e.g. an input port) of the filter unit 120, and a third port of the hybrid coupler 110 is connected to a second port (e.g. an output port) of the filter unit 120. The filter unit 120 may be configured with various types of filters such as a BPF, BRF, High Pass Filter (HPF), LPF, etc. If the filter unit 120 is configured with a BPF, the chameleon filter has BRF characteristics.

Figure 5A:
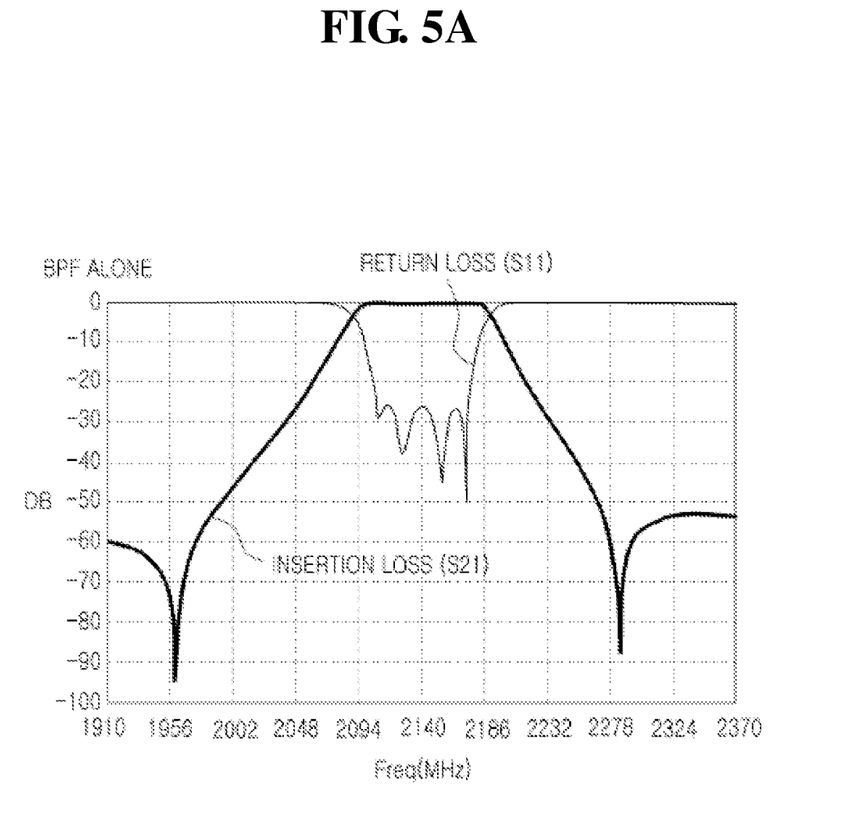
FIGS. 5A and 5B are diagrams illustrating the waveforms of signals in a general filter and a chameleon filter.
Figure 5B:
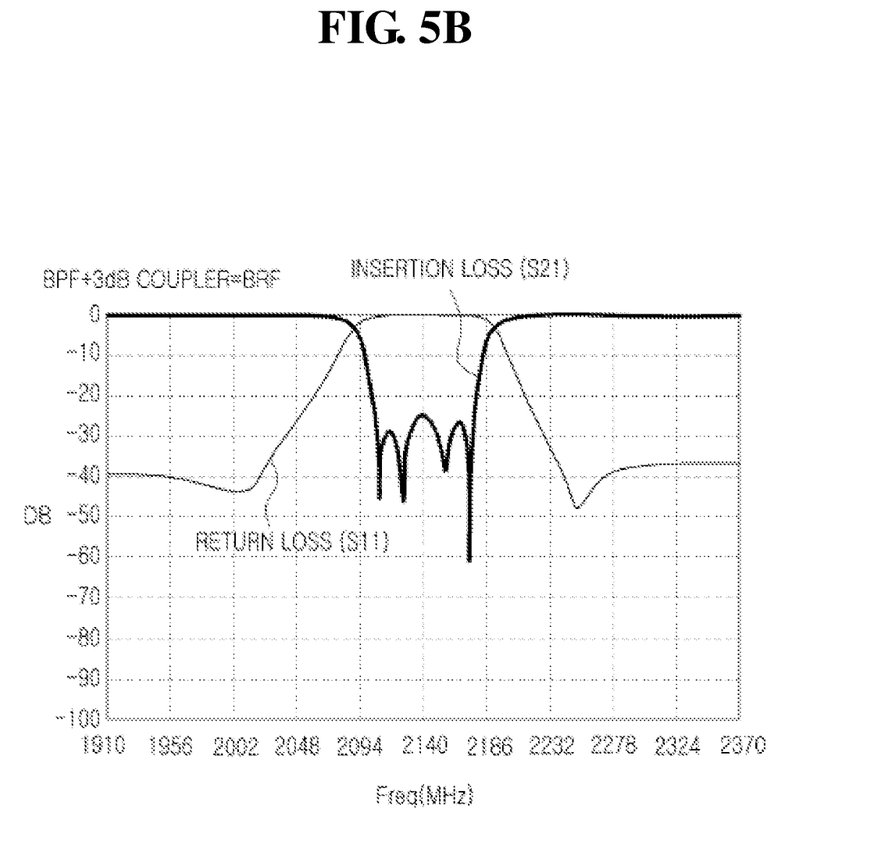

Characteristics of the filter unit 120 will be described with reference to FIGS. 5A and 5B, when the filter unit 120 is configured with a BPF. FIG. 5A illustrates the waveforms of a signal $S_{21}$ passed through the general BPF and a signal $S_{11}$ returned from the general BPF. FIG. 5B illustrates the waveforms of signals in the chameleon filter of the present invention in which the hybrid coupler 110 is combined with the filter unit 120 configured with a BPF in an RF system. Compared to FIG. 5A, the phases of the passed signal $S_{21}$ and the returned signal $S_{11}$ are inverted in FIG. 5B. Therefore, although the filter unit 120 is configured with a BPF in the chameleon filter of the present invention, its overall characteristics are BRF characteristics.

More specifically, a hybrid coupler generally functions to equally divide signal power with a phase difference of 90 degrees. For example, when a signal is input to the first port of the hybrid coupler 110, the power of the signal is equally divided into two parts with a 90-degree phase difference and then provided to the first and second ports of the filter unit 120 through the second port (0 degrees) and the third port (−90 degrees) of the hybrid coupler 110. Signals in the pass band of the filter unit 120 pass through the filter unit 120 and are fed back to the opposite ports, that is, the third and second ports of the hybrid coupler 110. Then the signals are combined due to the phase difference and output to the first port of the hybrid coupler 110, with no signal output to the fourth port of the hybrid coupler 110. Meanwhile, signals outside the pass band of the filter unit 120 do not pass through the filter unit 120, return from the first and second ports of the filter unit 120, and then are fed back to the second and third ports of the hybrid coupler 110, respectively. These signals are combined due to the phase difference and output to the fourth port of the hybrid coupler 110.

In conclusion, a signal of the pass band of the filter unit 120 in a signal input to the input port of the chameleon filter (i.e. the first port of the hybrid coupler) is reflected to the input port of the chameleon filter, whereas a signal outside the pass band of the filter unit 120 in the input signal is output to the output port of the chameleon filter (i.e. the fourth port of the hybrid coupler) in the whole filter structure.

Parts that divide/combine the power of signals according to their phase difference include a hybrid ring, a branchline directional coupler, a 3-dB directional coupler, a magic T, etc. If such a part is used instead of the hybrid coupler 110, it may be configured so as to adjust the phase of a signal using a phase shifter additionally. For example, if a magic T substitutes for the hybrid coupler 110, a phase shifter is provided on a connection path between a second port (or third port) of the magic T and the filter unit, to thereby shift the phase of a passed signal by 90 degrees.

If the chameleon filter having the above configuration according to the present invention is designed to operate as a BRF on the whole, that is, in a 'hybrid coupler+BPF' structure, it is more useful. That is, a typical BRF is designed by connecting resonators with one another via a 50-ohm (Ω) line. This structure requires a relatively large size and is complex. In addition, since much coupling does not occur between resonators, the BRF has limitations in rejecting a frequency band having a predetermined or wider bandwidth. In contrast, the chameleon filter of the present invention is relatively easily implemented and facilitates realization of a BRF using a BPF structure that can process a wide frequency band. The chameleon filter of the present invention can remarkably reduce path loss that may be caused as the total length of the 50-ohm line increases.

Further, the 50-ohm line should be lengthened or shortened with respect to a corresponding frequency in order to achieve notch characteristics in the general BRF. Thus it is difficult to achieve notch characteristics with the general BRF. However, the chameleon filter of the present invention realizes notch characteristics in the BPF and thus implements the BRF on the whole using the notch characteristics. Hence, the notch characteristics of the BRF are easily achieved and skirt characteristics can be improved.

Similarly, the chameleon filter of the present invention can realize an HPF structure on the whole using an LPF structure. In this case, an HPF which is relatively difficult to fabricate can be easily implemented.

Figure 2A:
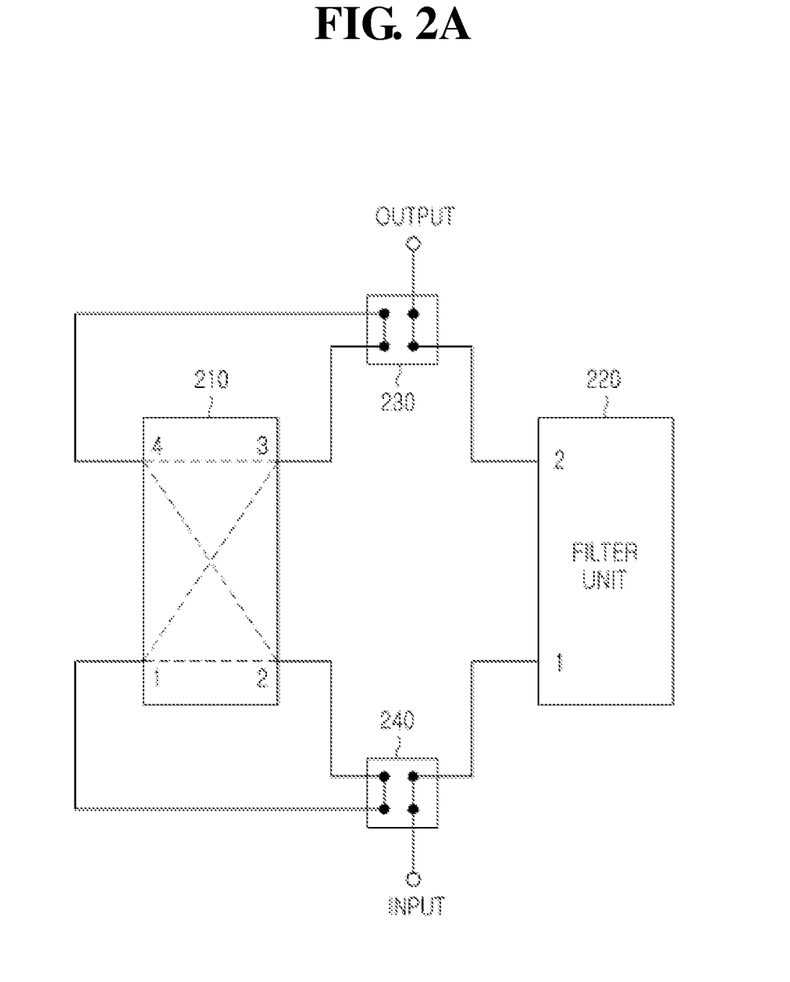
FIGS. 2A to 2D schematically illustrate the structure of a chameleon filter according to another embodiment of the present invention.
Figure 2B:
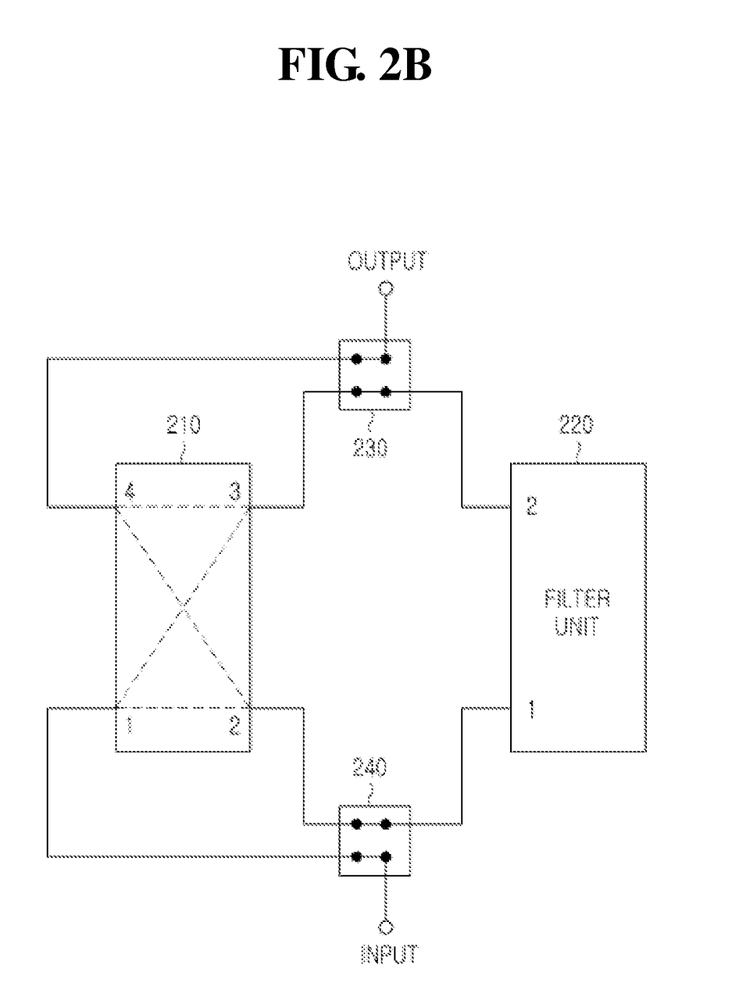
Figure 2C:
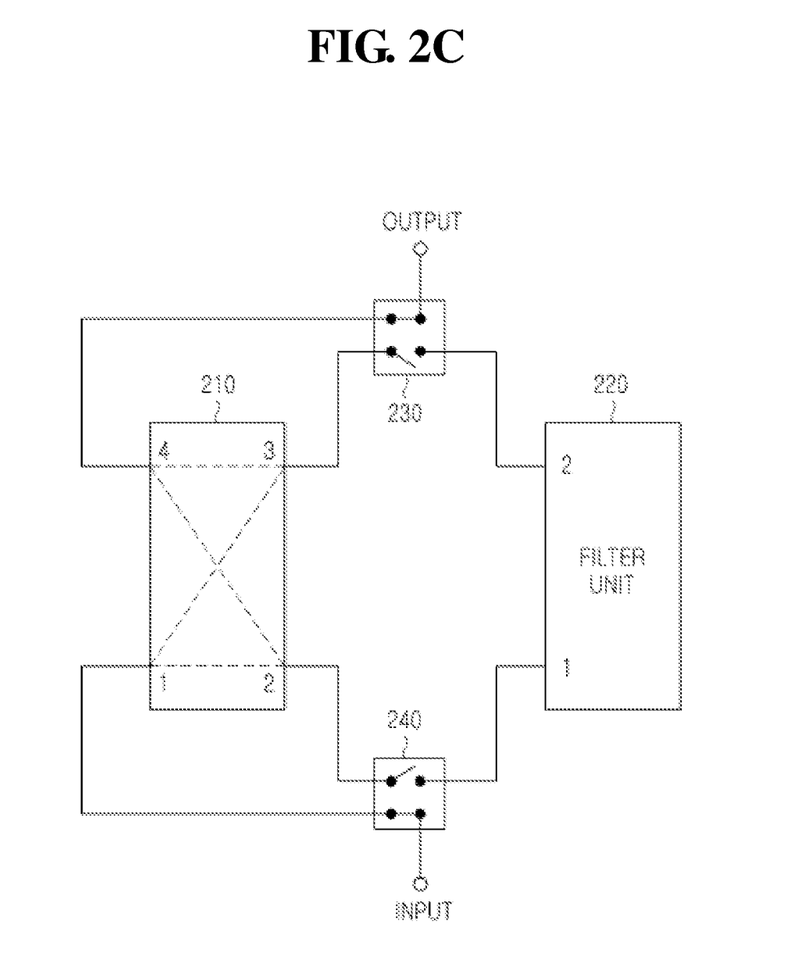
Figure 2D:
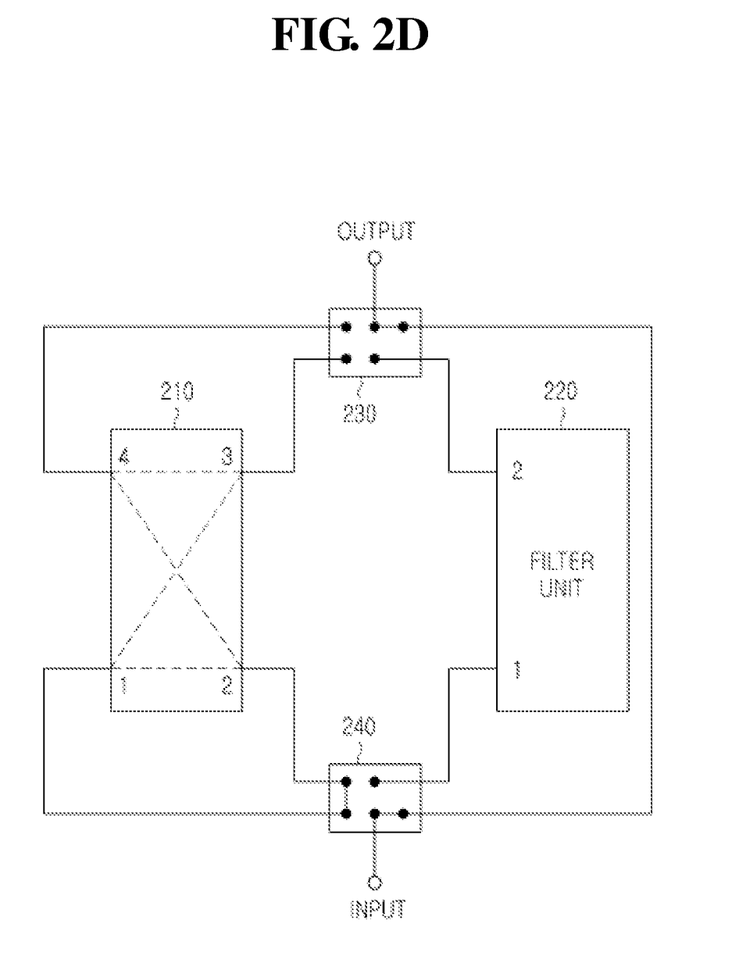

FIGS. 2A to 2D illustrate the structure of a chameleon filter according to another embodiment of the present invention. Referring to FIGS. 2A to 2D, the chameleon filter according to the second embodiment of the present invention includes a hybrid coupler 210, a filter unit 220, and first and second switch units 240 and 230. The hybrid coupler 210 and the filter unit 220 may be identical to their counterparts in the embodiment illustrated in FIG. 1. The first and second switch units 240 and 230 each may have a combination of general single on/off switches, or a combination of a Double Pole Double Throw (DPDT) switch and a general single on/off switch, which establishes a signal connection path dynamically according to an external switching control signal so that the input and output ports of the chameleon filter are connected directly to the filter unit (FIG. 2A), the input and output ports of the chameleon filter are connected to the filter unit indirectly via the hybrid coupler 210 (FIG. 2B), a signal passes through the hybrid coupler 210 (FIG. 2C), and a signal bypasses the hybrid coupler 210 and the filter unit 220 (FIG. 2D). Hereinbelow, with reference to FIGS. 2A and 2B, the structure and operation of the filter unit 220 will be described in detail, in the case where the filter unit 220 is configured with a BPF.

FIG. 2A illustrates the structure of a chameleon filter according to the present invention, when the chameleon filter operates as a BPF and FIG. 2B illustrates the structure of a chameleon filter according to the present invention, when the chameleon filter operates as a BRF.

Referring to FIG. 2A, in the case where the chameleon filter of the present invention operates as a BPF, when a signal is input to an input port of the first switch unit 240, the signal is output to an output port through the filter unit 220 configured with a BPF and the second switch unit 230. Therefore, there is no signal input and output to and from the hybrid coupler 210 and the chameleon filter of the present invention is used to pass a predetermined frequency band.

Referring to FIG. 2B, in the case where the chameleon filter of the present invention operates as a BRF, the first and second switch units 240 and 230 switch in a different manner from in FIG. 2A, such that a path is established to pass input and output signals through the hybrid coupler 210.

When a signal is input to the input port of the first switch unit 240, the signal is provided to a first port of the hybrid coupler 210, equally divided into two signals each having a half power with a phase difference of 90 degrees, and then output through second and third ports of the hybrid coupler 210. Signals of the pass band of the filter unit 220 in the divided two signals pass through the filter unit 220 and the first and second switches 240 and 230, whereas signals outside the pass band of the filter unit 220 in the divided two signals are reflected from the filter unit 220 and fed back to the second and third ports of the hybrid coupler 210. Signals of the pass band of the filter unit 220 in these input signals are output through the fourth port of the hybrid coupler 210. The signals output from the fourth port of the hybrid coupler 210 are output to the output port via the second switch 230.

Referring to FIG. 2C, an input signal is input only to the hybrid coupler 210. In this structure, the input signal bypasses the filter unit 220.

More specifically, a signal input to the first port of the hybrid coupler 210 is divided into two signals each having an equal half power, with a phase difference of 90 degrees. The divided signals are output through the second and third ports of the hybrid coupler 210, fully reflected from the first and second switches 240 and 230, and then fed back to the second and third ports of the hybrid coupler 210. These signals are combined due to the phase difference and then output through the fourth port of the hybrid coupler 210. The signal output from the fourth port of the hybrid coupler 210 is just output through the second switch 230.

The structure illustrated in FIG. 2C simply outputs an input signal without any signal processing. Thus the input signal bypasses the filter unit 220 without being filtered.

Like the structure illustrated in FIG. 2C, a signal bypasses the filter unit 220. A signal input to the input port of the first switch 240 bypasses the filter unit 220 or the hybrid coupler 210 in a bypass path and is output to the output port via the second switch 230.

As illustrated in FIGS. 2C and 2D, the filter of the present invention may be appropriate for a wireless communication system in which filter is not required in an initial use environment and then required in a subsequent use environment.

For example, it may occur that a mobile communication BS system should return a part of a used frequency band on a service provider basis. For example, a specific service provider may use 800 to 825 MHz in a current year and then may use only 810 to 825 MHz in the next year. That is, the service provider should return the frequency band from 800 MHz to below 810 MHz.

In this case, the service provider should install a BRF that rejects the frequency band from 800 MHz to below 810 MHz or a BPF that passes only 810 to 825 MHz in every BS. It is almost impossible to simultaneously install the filters in all BSs distributed nationwide. Therefore, the filters are sequentially installed in the BSs over a relative long period (e.g. 6 months) before the next year.

However, BSs in which filters are installed early cannot service the frequency band from 800 MHz to below 810 MHz. In this case, use of the filter according to the present invention enables signal bypassing despite the preliminary filter installation in the BS. Thus an entire serviceable band can be used in the current year. In the next year, signals pass through the filters through switching control of the filters in the BSs so that the service band of all BSs may be changed to 810 to 825 MHz almost simultaneously.

While FIGS. 2A to 2D have been described in the context of the filter unit 220 being a BPF, it is clearly understood that the BPF may be replaced with another filter such as a BRF, an HPF, an LPF, etc.

Figure 3:
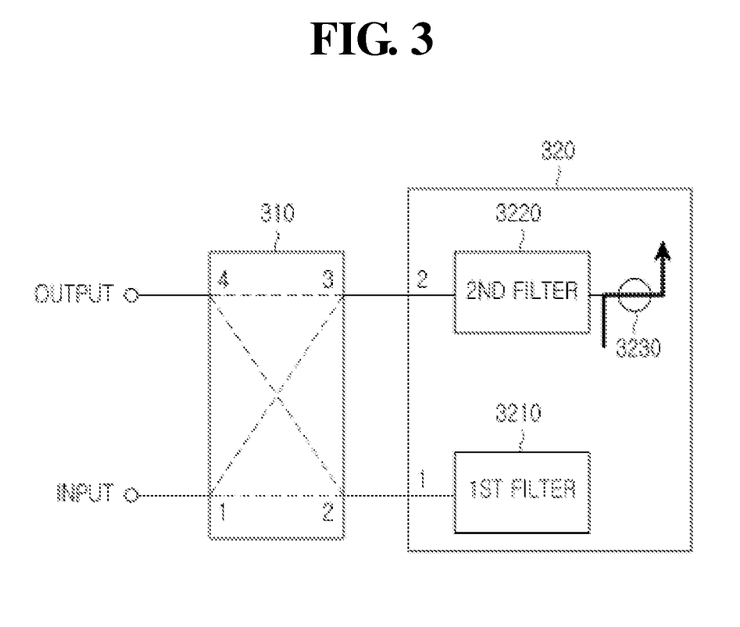
FIG. 3 schematically illustrates the structure of a chameleon filter according to a third embodiment of the present invention.

FIG. 3 illustrates the structure of a chameleon filter according to a third embodiment of the present invention.

Referring to FIG. 3, the chameleon filter according to the third embodiment of the present invention includes a hybrid coupler 310 and a filter unit 320. While the filter units may be configured with a single filter in the first and second embodiments of the present invention, the filter unit 320 includes at least two identical filters, that is, first and second filters 3210 and 3220. The filter unit 320 further includes a phase shifter 3230. More specifically, the chameleon filter according to the third embodiment of the present invention is configured such that a first port of the hybrid coupler 310 serves as an input port of the chameleon filter, a fourth port of the hybrid coupler 310 serves as an output port of the chameleon filter, a second port of the hybrid coupler 310 is connected to a first port (e.g. an input port) of the first filter 3210, and a third port of the hybrid coupler 310 is connected to a first port (e.g. an input port) of the second filter 3220. In addition, a second port (e.g. an output port) of the first filter 3210 is opened and a second port (e.g. an output port) of the second filter 3220 is connected to an end of the phase shifter 3230. The other end of the phase shifter 3230 is opened.

A signal input to the hybrid coupler 310 through the first port is equally divided into two signals each having a half power, with a phase difference of 90 degrees and output through the second and third ports of the hybrid coupler 310. Signals of the pass bands of the first and second filters 3210 and 3220 in the output signals are input to the first and second filters 3210 and 3220 and signals outside the pass bands of the first and second filters 3210 and 3220 are reflected from the first and second filters 3210 and 3220. As described before, the first and second filters 3210 and 3220 may be the same types of filters, such as BPFs, BRFs, HPFs, LPFs, etc.

Signals outside the pass bands of the first and second filter 3210 and 3220 are reflected from the first and second filter 3210 and 3220, fed back to the second and third ports of the hybrid coupler 310, and then output through the fourth port of the hybrid coupler 310.

Meanwhile, since the second port of the second filter 3220 is connected to the phase shifter 3230, the phase variation of a signal of the pass band passed through the second filter 3220 can be adjusted dynamically. Hence, the signal in the pass band of the second filter 3220 is phase-shifted in the phase shifter 3230, reflected from the open port of the phase shifter 3230, and fed back to the third port of the hybrid coupler 310 through the second filter 3220. The signal in the pass band of the first filter 3210 is reflected from the open port of the first filter 3210 and fed back to the second port of the hybrid coupler 310. If the signal whose phase variation was not adjusted (the signal input from the first filter 3210) and the signal whose variation was adjusted (the signal input from the second filter 3220) are input to the hybrid coupler 310 through the second and third ports of the hybrid coupler 310, respectively, the phase difference between the signals is not accurately 90 degrees. Consequently, the signals are divided into the first and fourth ports of the hybrid coupler 310 according to the phase difference.

It can be concluded that parts of signals in the pass bands of the first and second filters 3210 and 3220 are leaked to the fourth port of the hybrid coupler 310 according to the phase variation adjusted by the phase shifter 3230 in the chameleon filter according to the third embodiment of the present invention, illustrated in FIG. 3. For example, if the first and second filters 3210 and 3220 are BPFs, the chameleon filter operates as a BRF on the whole and the loss bandwidth (dB) of a signal in a rejection band of the chameleon filter is changed according to a phase variation controlled by the phase shifter 3230. This chameleon filter is applicable to a system in which the rejected amount of a signal in a rejection band needs to be adjusted.

Figure 4:
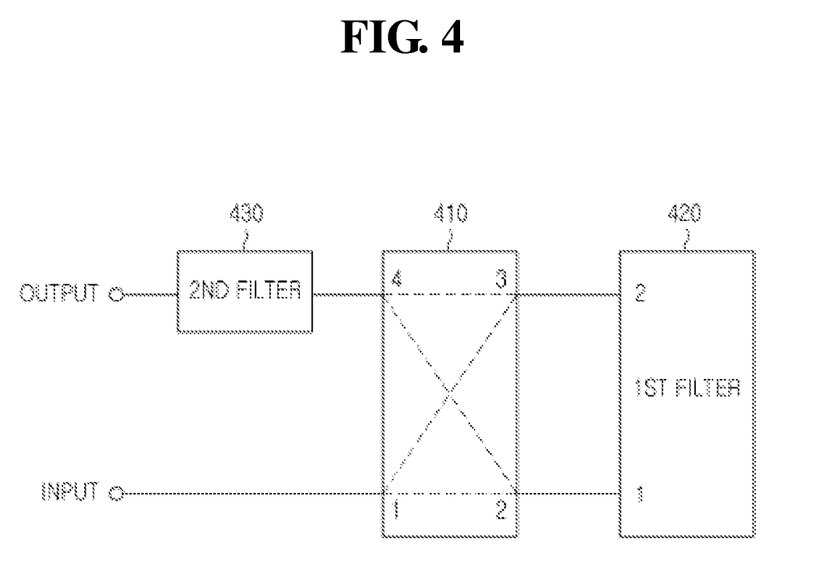
FIG. 4 schematically illustrates the structure of a chameleon filter according to a fourth embodiment of the present invention.

FIG. 4 illustrates the structure of a chameleon filter according to a fourth embodiment of the present invention.

Referring to FIG. 4, the chameleon filter according to the fourth embodiment of the present invention includes a first filter unit 420, a hybrid coupler 410, and a second filter unit 430 and has a low signal loss equal to or smaller than a predetermined threshold. The chameleon filter is similar to the chameleon filter according to the first embodiment, except that the second filter unit 430 is further installed between a fourth port of the hybrid coupler 410 and an output port of the chameleon filter. The number of resonators may differ for the first and second filter units 420 and 430. For instance, the second filter unit 430 may be configured with a 6-stage BPF and the first filter unit 420 may be configured with a 4-stage BPF. In this case, the hybrid coupler 410 and the first filter unit 420 in combination may create BRF characteristics. That is, the chameleon filter according to the fourth embodiment of the present invention is a combination of a BPF structure and a BRF structure. If the rejection band of the BRF structure is positioned at one band edge of the BPF, this structure may have less signal loss and similar or improved characteristics of one band edge, for example, compared to a 10-stage BPF structure.

It is clear also in FIG. 4 that the first and second filter units 420 and 430 may be replaced with various filters other than BPFs, such as BRFs, HPFs, LPFs, etc. While it has been described in FIGS. 1 to 4 that the chameleon filters are configured with filters (i.e. indicated by reference numerals 120, 220, 320, 330, 410 and 430), other mobile communication parts may be used instead of the filters 120, 220, 320, 330, 410 and 430, to thereby achieve a similar function to the function of a chameleon filter.

As is apparent from the above description of the embodiments of the present invention, because the present invention provides a new filter by combining a filter with a hybrid coupler, it can reduce the path loss of a signal, improve band edge characteristics, easily invert signal characteristics, reject a wide frequency band by increasing coupling between resonators, and facilitate design of notch characteristics.

While embodiments have been shown and described with reference to the drawings, it will be understood by those skilled in the art that various changes in form and details may be made therein without departing from the spirit and scope of the inventive concept as defined by the appended claims.

What is claimed is:

1. A Radio Frequency (RF) filter comprising:
a coupler configured to receive an input signal through a first port of the coupler, to divide the input signal, to output the divided signals through second and third ports of the coupler, to combine signals received through the second and third ports of the coupler according to phases of the signals, and to output the combined signal through the first port of the coupler or as an output signal of the RF filter through a fourth port of the coupler;
a first filter unit having a first port of the first filter unit connected to the second port of the coupler and a second port of the first filter unit connected to the third port of the coupler, for having a predetermined frequency filtering characteristic;
and first and second switch units having the coupler and the first filter unit disposed therebetween for dynamically establishing a signal path according to an external switching control signal so that input and output ports of the RF filter are connected to the first filter unit directly or indirectly via the coupler, wherein a signal passes through the coupler, or a signal passes through the filter or a signal bypasses the first filter unit and the coupler.

2. The RF filter of claim 1, wherein each of the first and second switch units has a combination of single on/off switches or a combination of a Double Pole Double Throw (DPDT) switch and single on/off switches.

3. The RF filter of any of claim 1, wherein the coupler includes a phase shifter provided on a path between the second port of the coupler and the first port of the first filter unit or between the third port of the coupler and the second port of the first filter unit, for shifting a phase of a passed signal by 90 degrees.

4. The RF filter of claim 1, wherein each of the first and second switch units are selectively configured to perform a band rejection filter operation.

5. The RF filter of claim 1, wherein each of the first and second switch units are selectively configured to perform a low pass filter operation.

6. The RF filter of claim 1, wherein each of the first and second switch units are selectively configured to perform a bypass operation.

7. The RF filter of claim 1, wherein the coupler is a hybrid coupler.

8. The RF filter of claim 1, wherein the first filter unit comprises:
a first filter having one end connected to the first port of the first filter unit and the other end that is opened;
a second filter having one end connected to the second port of the first filter unit; and a phase shifter having one end connected to the other end of the second filter and the other end that is opened.

9. The RF filter of claim 8, wherein the first filter unit is one of a Band Rejection Filter (BRF), a Band Pass Filter (BPF), a Lower Pass Filter (LPF), wherein if the RF filter requires a BPF characteristic on the whole, the first and second filters of the first filter are BRFs, if the RF filter requires a BRF characteristic on the whole, the first and second filters of the first filter unit are BPFs, if the RF filter requires an HPF characteristic on the whole, the first and second filters of the first filter unit are LPFs, and if the RF filter requires an LPF characteristic on the whole, the first and second filters of the first filter unit are HPFs.

10. The RF filter of claim 8, further comprising a second filter unit connected to the fourth port of the coupler, for outputting an output signal of the RF filter.

11. The RF filter of claim 8, wherein the coupler is a hybrid coupler.

12. The RF filter of claim 8, wherein the coupler is a magic T, further comprising a phase shifter provided on a path between the second port of the coupler and the first port of the first filter unit or between the third port of the coupler and the second port of the first filter unit for shifting a phase of a passed signal by 90 degrees.

13. The RF filter of claim 8, further comprising first and second switch units for dynamically establishing a signal path according to an external switching control signal so that input and output ports of the RF filter are connected to the first filter unit directly or indirectly via the coupler, a signal passes only though the coupler, or a signal bypasses the first filter unit and the coupler.

14. The RF filter of claim 13, wherein each of the first and second switch units has a combination of single on/off switches or a combination of a Double Pole Double Throw (DPDT) switch and single on/off switches.

* * * * *